(12) United States Patent
Hatakeyama et al.

(10) Patent No.: US 8,378,431 B2
(45) Date of Patent: Feb. 19, 2013

(54) SEMICONDUCTOR DEVICE AND METHOD FOR PRODUCING THE SEMICONDUCTOR DEVICE

(75) Inventors: Masanori Hatakeyama, Yokohama (JP); Hiroki Murotani, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 155 days.

(21) Appl. No.: 13/050,505

(22) Filed: Mar. 17, 2011

(65) Prior Publication Data

US 2011/0233640 A1 Sep. 29, 2011

(30) Foreign Application Priority Data

Mar. 24, 2010 (JP) ................................. 2010-068261

(51) Int. Cl.
*H01L 27/115* (2006.01)
*H01L 21/762* (2006.01)

(52) U.S. Cl. ................ 257/392; 257/501; 257/E21.546; 257/E27.103

(58) Field of Classification Search .................. 257/506, 257/368, 392, 501, E21.546, E27.103; 438/258, 438/296
See application file for complete search history.

(56) References Cited

U.S. PATENT DOCUMENTS

| 7,847,337 | B2 | 12/2010 | Iwase et al. | |
|---|---|---|---|---|
| 7,855,116 | B2 * | 12/2010 | Kiyotoshi | 438/275 |
| 7,863,668 | B2 | 1/2011 | Takahashi | |
| 7,998,811 | B2 | 8/2011 | Takahashi | |
| 2006/0278919 | A1 | 12/2006 | Takahashi | |
| 2008/0308859 | A1 | 12/2008 | Iwase et al. | |
| 2009/0130809 | A1* | 5/2009 | Sakagami | 438/257 |
| 2009/0315096 | A1* | 12/2009 | Wei et al. | 257/315 |
| 2011/0053363 | A1 | 3/2011 | Iwase et al. | |
| 2011/0076834 | A1 | 3/2011 | Takahashi | |
| 2011/0244650 | A1* | 10/2011 | Ema et al. | 438/427 |
| 2012/0025295 | A1* | 2/2012 | Sakagami | 257/316 |
| 2012/0181592 | A1* | 7/2012 | Wang | 257/314 |

FOREIGN PATENT DOCUMENTS

| JP | 2002-26117 | 1/2002 |
|---|---|---|
| JP | 2003-289114 | 10/2003 |
| JP | 2006-344900 A | 12/2006 |
| JP | 2008-311312 A | 12/2008 |
| JP | 2009-54956 | 3/2009 |
| JP | 2009-117779 | 5/2009 |

OTHER PUBLICATIONS

Office Action issued Jul. 27, 2012 in Japanese Patent Application No. 2010-068261 (with English-language translation).

* cited by examiner

*Primary Examiner* — George Fourson, III
(74) *Attorney, Agent, or Firm* — Oblon, Spivak, McClelland, Maier & Neustadt, L.L.P.

(57) ABSTRACT

In one embodiment, a semiconductor device includes a substrate; a gate insulating film; first trenches in a cell array region; first embedded insulating films in the first trenches; second trenches in a peripheral circuit region; second embedded insulating films in the second trenches; a third trench in an isolation region; a third embedded insulating film in the third trench; gate structures; and inter-gate insulating films between the gate structures covering the first, second and third embedded insulating films. An upper surface of the third embedded insulating film covered with the inter-gate insulating film is substantially flat. Upper surfaces of the first, second, and third embedded insulating films are higher than an upper surface of the gate insulating film. The upper surfaces of the first and third embedded insulating films are lower than the upper surfaces of the second embedded insulating films.

20 Claims, 10 Drawing Sheets

SEMICONDUCTOR DEVICE AND METHOD FOR PRODUCING THE SEMICONDUCTOR DEVICE

CROSS-REFERENCE TO RELATED APPLICATION

This application is based upon and claims the benefit of priority from prior Japanese Patent Application No. 2010-68261, filed on Mar. 24, 2010, the entire contents of which are incorporated herein by reference.

FIELD

Embodiments of the present invention relate to a semiconductor device and a method for producing the semiconductor device.

BACKGROUND

A NAND flash memory includes a plurality of memory cell transistors, each having a laminated gate structure constituted by a floating gate and a control gate.

More specifically, the NAND flash memory includes a plurality of memory cell arrays. Each memory cell array includes a plurality of memory cell transistors connected to each other and selection gate transistors provided at both ends of the plurality of connected memory cell transistors. The plurality of memory cell transistors are arranged with a predetermined interval therebetween in a row direction in a cell array region of the NAND flash memory. Each Shallow Trench Isolation (STI) region is formed between every adjacent pair of memory cell transistors in the row direction. Each STI region is formed with a trench. A device isolation insulating film is embedded into each trench.

Further, the NAND flash memory includes not only the above cell array region but also a peripheral circuit region having a plurality of peripheral transistors. An STI region is formed between the peripheral circuit region and the cell array region. This STI region formed between the peripheral circuit region and the cell array region has a larger width than the STI region formed between every adjacent pair of memory cell transistors. A trench is formed in the STI region between the peripheral circuit region and the cell array region. A device isolation insulating film is embedded into this trench. Further, inter-gate insulating films are formed on this device isolation insulating film.

Nowadays, the NAND flash memories are required to have finer structures. Accordingly, the spaces between the memory cell transistors and the peripheral transistors are increasingly reduced.

DETAILED DESCRIPTION

Figure 1:
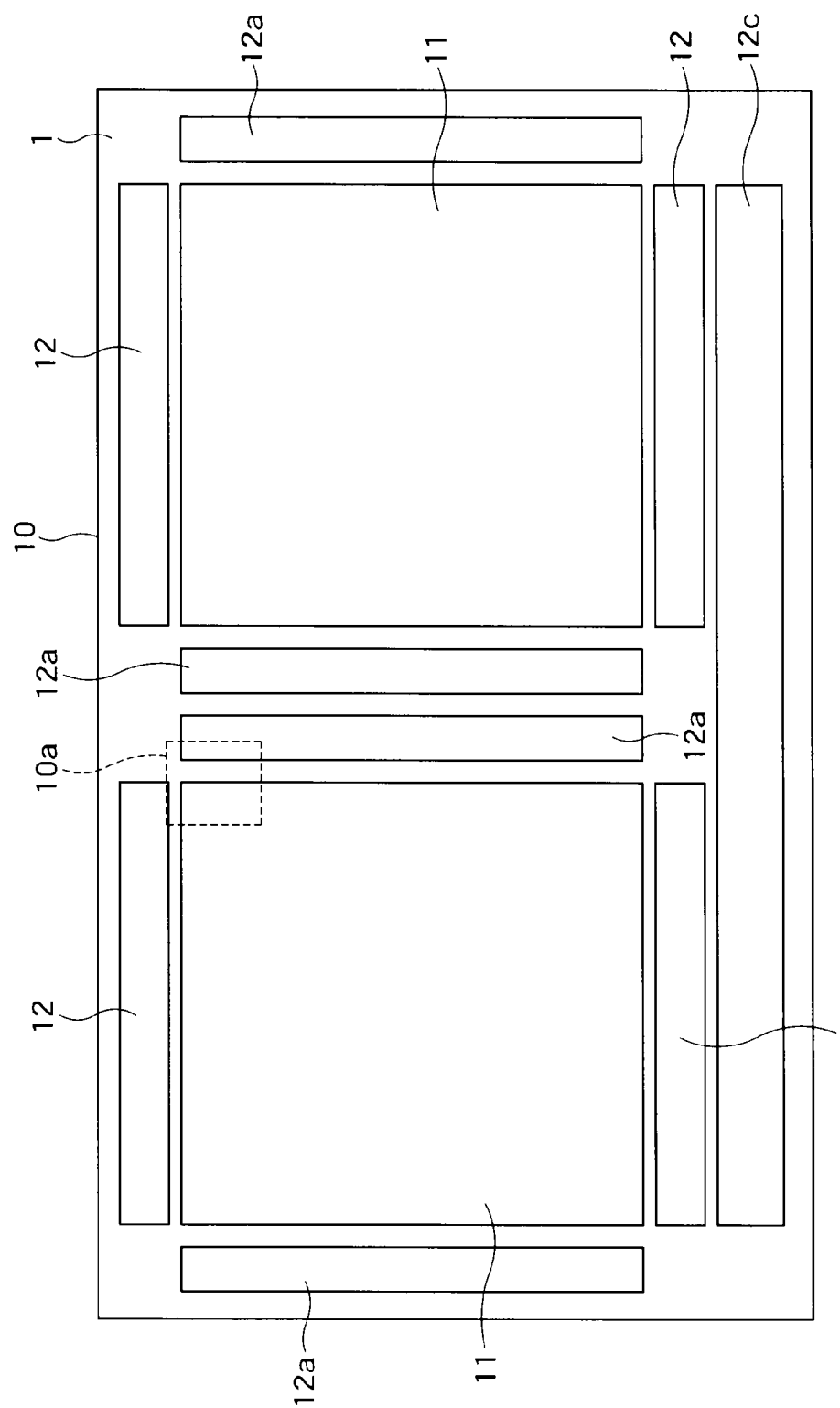
FIG. 1 is a plan view illustrating a pattern layout of the entire chip of an NAND flash memory according to an embodiment of the present invention.

According to an embodiment of the present invention, a semiconductor device includes a cell array region and a peripheral circuit region provided adjacent to the cell array region with an isolation region interposed therebetween. The semiconductor device includes a substrate; a gate insulating film formed on the substrate; a plurality of first trenches formed in a column direction in the cell array region, the plurality of first trenches penetrating through the gate insulating film and reaching into the substrate; a plurality of first embedded insulating films embedded in the plurality of first trenches; a plurality of second trenches formed in the column direction in the peripheral circuit region, the plurality of second trenches penetrating through the gate insulating film and reaching into the substrate; a plurality of second embedded insulating films embedded in the plurality of second trenches; a third trench formed in the isolation region, the third trench reaching into the substrate; a third embedded insulating film embedded in the third trench; a plurality of gate structures formed on the gate insulating film in a row direction crossing the column direction so as to extend over the cell array region, the peripheral circuit region, and the isolation region; and a plurality of inter-gate insulating films formed in the row direction between the plurality of gate structures, the plurality of inter-gate insulating films covering the plurality of first embedded insulating films, the plurality of second embedded insulating films, and the third embedded insulating film. An upper surface of the third embedded insulating film covered with each of the plurality of inter-gate insulating films is substantially flat. Upper surfaces of the plurality of first embedded insulating films, upper surfaces of the plurality of second embedded insulating films, and the upper surface of the third embedded insulating film are higher than an upper surface of the gate insulating film. The height of the upper surfaces of the plurality of first embedded insulating films and the upper surface of the third embedded insulating film is lower than the height of the upper surfaces of the plurality of second embedded insulating films.

Hereafter, Embodiments according to the present invention will be explained with reference to drawings. In the explanation, portions common to all the drawings are denoted with the same reference numerals.

Before explaining the present embodiment, examination of a NAND flash memory uniquely conducted by the present inventors will be explained. This examination is conducive to the creation of the present embodiment.

The present inventors have conducted unique examination of a short circuit, i.e., one of the reasons for deteriorating yields, in order to improve yields of production of the NAND flash memory.

More specifically, the present inventors use an examination method for finding a position of a short circuit, e.g., EMS (emission micro scope) and OBIRCH (optical beam induced resistance charge), to examine malfunctioning NAND flash memories. As a result, the present inventors have found that a short circuit occurred in an STI region between a cell array region and a row decoder unit adjacent thereto on a plane of a NAND flash memory. More specifically, the present inventors have found that the short circuit occurred in a portion of the STI region on the side of the row decoder unit. Further, the present inventors have found that the short-circuited portion has voids and foreign substances in the voids.

In view of the examination result, the present inventors have analyzed the reasons of short circuits as follows.

Each inter-gate insulating film is formed so as to be embedded between word lines. In the forming process, voids may be generated in each inter-gate insulating film.

More specifically, the voids are generated since the inter-gate insulating films cannot be sufficiently embedded when the inter-gate insulating films are formed. In other words, when the inter-gate insulating films are embedded in narrow regions, it is difficult to sufficiently embed the inter-gate insulating films, resulting in the voids generated in the inter-gate insulating films. The inter-gate insulating films are deposited so that the inter-gate insulating films attach to sidewalls of the word lines, enclosing regions in which the inter-gate insulating films are embedded. Thus, the inter-gate insulating films are formed in a form of overhang. The overhang inter-gate insulating films serve like lids to cover the voids, and the inter-gate insulating films are deposited on the lids. Therefore, the voids are not filled with the inter-gate insulating films, and the voids remain in the inter-gate insulating films.

On the other hand, when the inter-gate insulating films are embedded in wide regions, the distance between sidewalls enclosing a region in which the inter-gate insulating film is embedded is long. Therefore, if the voids are formed in each inter-gate insulating film, the overhang inter-gate insulating films deposited in such a manner to attach to the sidewalls are difficult to be deposited to cover the voids. Therefore, since the voids are not covered with the lids of the inter-gate insulating films, the voids are filled with the inter-gate insulating films, and further, new voids are generated on the voids filled with the inter-gate insulating films. Therefore, the voids are more likely to remain in upper portions of the inter-gate insulating films.

After the inter-gate insulating films are formed, the process for forming the silicide electrodes is performed. During the process, upper surfaces of the inter-gate insulating films are etched.

Therefore, when the voids remain in proximity to the upper surfaces of the inter-gate insulating films, the voids may be exposed on the upper surfaces as a result of the etching.

Thereafter, cobalt, nickel, and the like are deposited to form silicide electrodes. However, the cobalt, nickel, and the like may fill the exposed voids. This means that the foreign substances in the voids are considered to be cobalt, nickel, and the like. The cobalt, nickel, and the like are considered to serve as passes that make conduction between electrodes, thus causing a short circuit.

In view of the above unique considerations, the present inventors have conceived of the embodiment as described below in order to avoid a short circuit in NAND flash memories.

Subsequently, a semiconductor device according to the present embodiment will be explained with reference to FIGS. 1 to 6. In this case, a NAND flash memory is explained as an example. However, the present invention is not limited to the NAND flash memory, and can be used for other semiconductor devices.

FIG. 1 is a plan view illustrating a pattern layout of the entire chip of an NAND flash memory 1 according to the present embodiment.

As shown in FIG. 1, numeral 10 denotes a memory chip. Numeral 11 denotes a cell array region. Numeral 12 denotes a sense amplifier unit (peripheral circuit region). Numeral 12a denotes row decoder unit (peripheral circuit region). Numeral 12c denotes a peripheral circuit unit (peripheral circuit region) including a control circuit and the like. In the cell array region 11, a plurality of memory cell transistors are connected in series, and a plurality of memory cell units (NAND columns), both ends of which are connected to selection gate transistors, are provided in a matrix form, which are not shown in FIG. 1.

Figure 2:
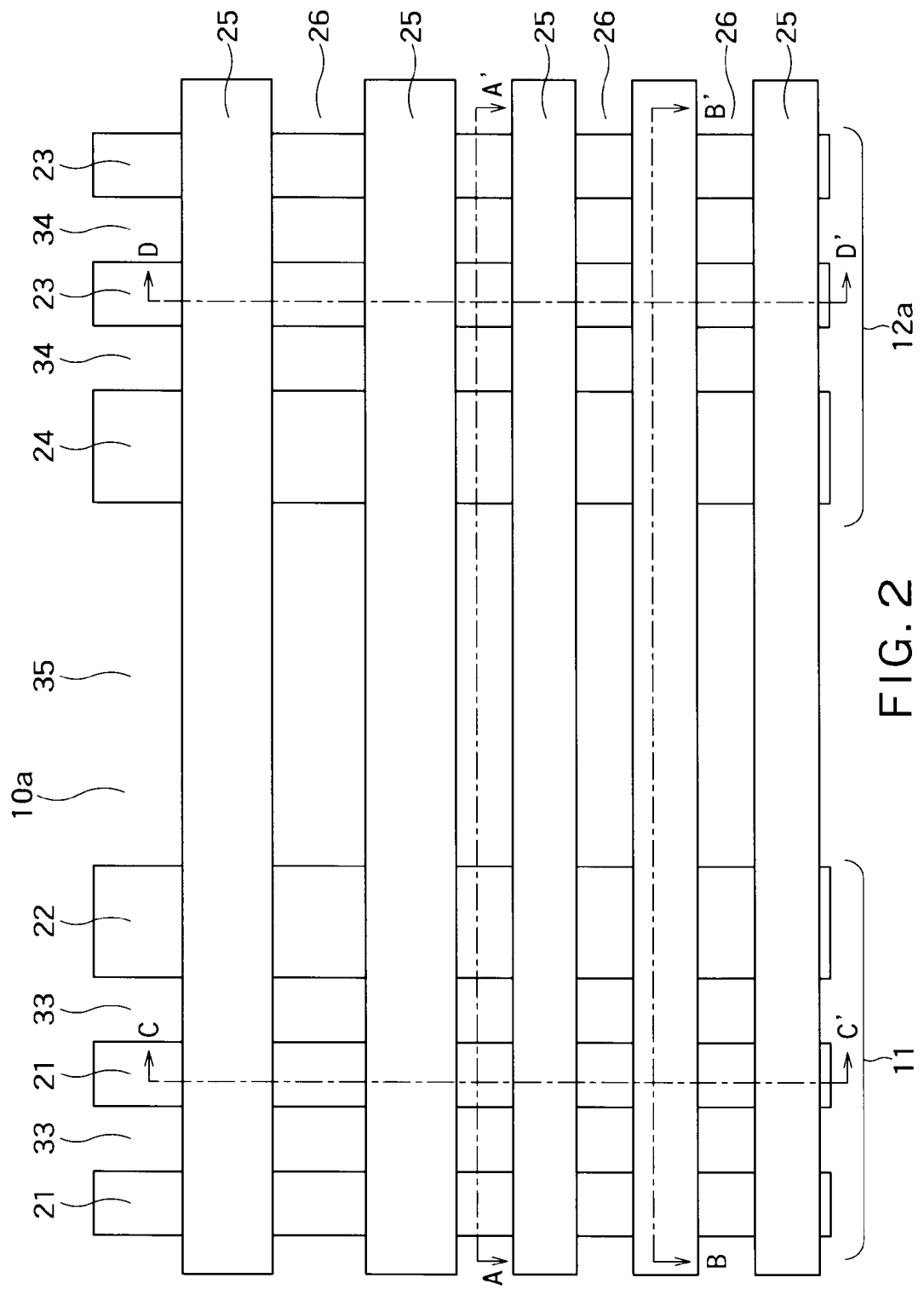
FIG. 2 is a plan view illustrating a pattern layout in proximity to an end portion in a row direction of a cell array region of FIG. 1.

FIG. 2 is a plan view illustrating a pattern layout of a portion of a chip in a region 10a of FIG. 1. More specifically, FIG. 2 is a plan view illustrating a pattern layout in a region at an end portion in a row direction of the cell array region 11 of FIG. 1 and a region of an end portion in the row direction of a row decoder unit 12a adjacent thereto. The row direction is a horizontal direction of FIG. 2.

As shown in FIG. 2, in the region at the end portion in the row direction of the cell array region 11, a plurality of memory cell transistor device regions 21 are provided in a column direction (vertical direction of FIG. 2). A cell array region dummy device region 22 is provided in the column direction at the end portion of the cell array region 11. An STI region 33 is formed between every adjacent pair of memory cell transistor device regions 21 in order to isolate the memory cell transistor device regions 21. Further, an STI region 33 is also formed between the memory cell transistor device region 21 and the cell array region dummy device region 22 in order to isolate the memory cell transistor device region 21 and the cell array region dummy device region 22.

Further, as shown in FIG. 2, in the region at the end portion in the row direction of the row decoder unit 12a, a plurality of peripheral transistor device regions 23 are provided in the column direction. At the end portion of the row decoder unit 12a, a peripheral region dummy device region 24 is provided in the column direction. An STI region 34 is formed between every adjacent peripheral transistor device regions 23 in order to isolate the peripheral transistor device regions 23. Further, an STI region 34 is also formed between the peripheral transistor device region 23 and the peripheral region dummy device region 24 in order to isolate the peripheral transistor device region 23 and the peripheral region dummy device region 24.

An STI region (isolation region) 35 is formed between the cell array region 11 and the row decoder unit 12a adjacent thereto, i.e., between the cell array region dummy device region 22 and the peripheral region dummy device region 24, in order to isolate the cell array region 11 and the row decoder unit 12a. As can be seen from FIG. 2, the row-direction width of the STI region 35 for isolating the cell array region 11 and the row decoder unit 12a is larger than the row-direction widths of the STI regions 33 for isolating the memory cell transistors and the STI regions 34 for isolating the peripheral transistors.

Further, a plurality of silicide electrodes 25 are formed in the row direction on the cell array region 11, the row decoder unit 12a adjacent thereto, and the STI region 35 therebetween. Inter-gate insulating films 26 are respectively embedded between the silicide electrodes 25.

Figure 3:
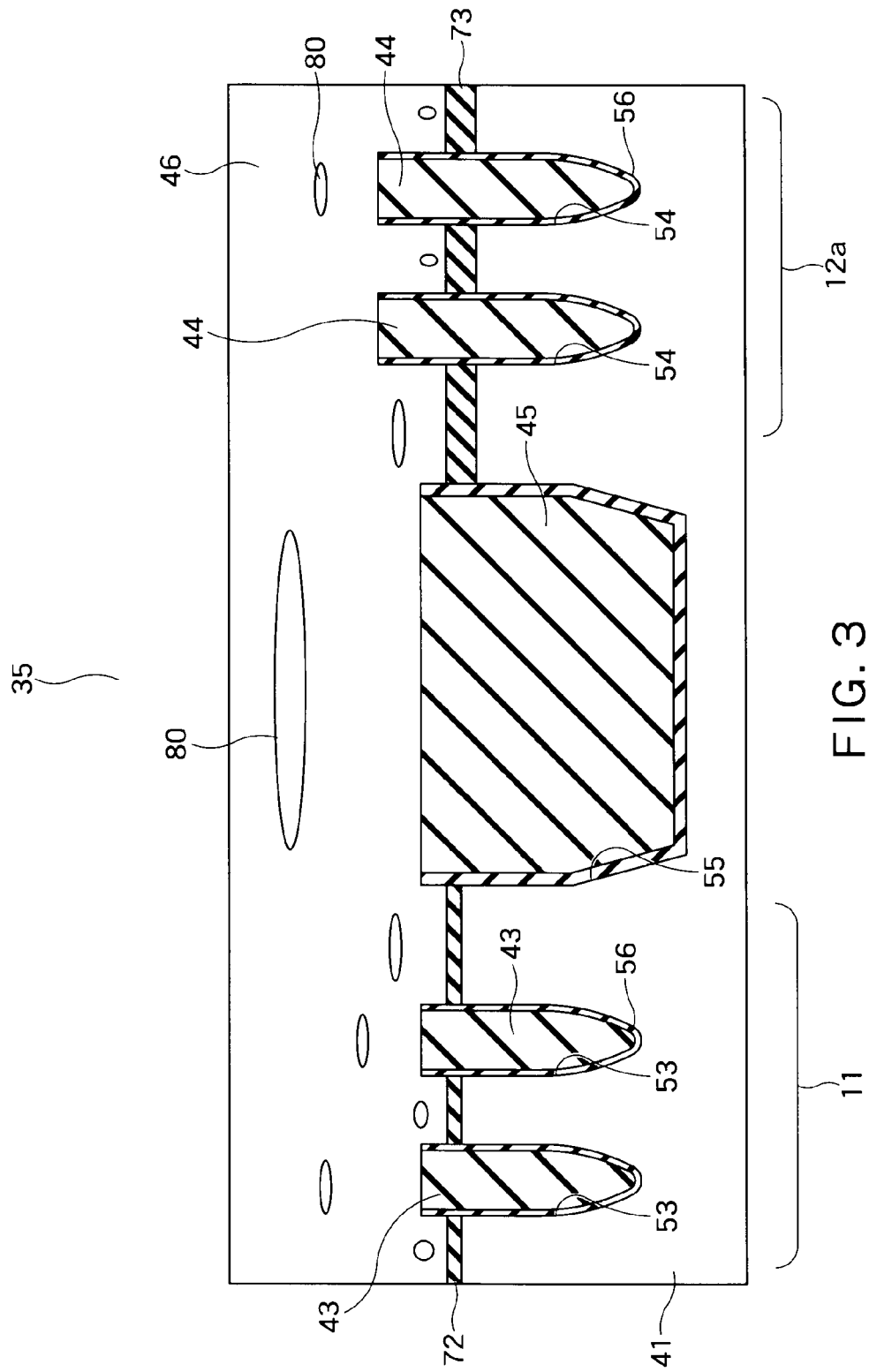
FIG. 3 is a cross sectional view (part 1) illustrating the NAND flash memory according to the embodiment.

FIG. 3 is a cross sectional view taken along a line A-A' of FIG. 2. In FIG. 3, the left side is the cell array region 11, and the right side is the row decoder unit 12a. Further, the STI region 35 is provided between the cell array region 11 and the row decoder unit 12a to isolate the cell array region 11 and the row decoder unit 12a.

More specifically, in the cell array region 11, a gate insulating film 72 is provided on a semiconductor substrate 41, and a plurality of trenches 53 are formed to penetrate through the gate insulating film 72 to reach into the semiconductor substrate 41. In each trench 53, a device isolation insulating film 43 is embedded. Each device isolation insulating film 43 is formed so that the upper surface of the device isolation insulating film 43 is higher than the upper surface of the gate insulating film 72.

In the row decoder unit 12a, a gate insulating film 73 is provided on the semiconductor substrate 41, and a plurality of trenches 54 are formed to penetrate through the gate insulating film 73 to reach into the semiconductor substrate 41. In each trench 54, a device isolation insulating film 44 is embedded. Each device isolation insulating film 44 is formed so that the upper surface of the device isolation insulating film 44 is higher than the upper surface of the gate insulating film 73. The gate insulating film 73 provided in the row decoder unit 12a may be thicker than the gate insulating film 72 provided in the cell array region 11.

A trench 55 is formed in the STI region 35. The trench 55 is wider in the row direction than the trenches 53 and 54 formed in the cell array region 11 and the row decoder unit 12a. A device isolation insulating film 45 is embedded in the trench 55. The device isolation insulating film 45 is formed such that the upper surface of the device isolation insulating film 45 is higher than the upper surfaces of the gate insulating films 72 and 73 provided in the cell array region 11 and the row decoder unit 12a.

Further, inter-gate insulating films 46 are formed to cover the device isolation insulating films 43, 44, and 45 and the gate insulating films 72 and 73. The inter-gate insulating films 46 are made of, for example, silicon oxide. In the STI region 35, the upper portion of the device isolation insulating film 45 on which the inter-gate insulating films 46 are formed is substantially flat. The height of the upper surfaces of the device isolation insulating films 43 and 45 is lower than the height of the upper surfaces of the device isolation insulating films 44. The height of the upper surfaces of the device isolation insulating films 43 may be substantially the same as the height of the upper surface of the device isolation insulating film 45. As shown in FIG. 3, voids 80 may be generated in the inter-gate insulating films 46 as described above.

Protective films 56 may be formed to cover walls and bottom surfaces inside of the trenches 53, 54, and 55.

Figure 4:
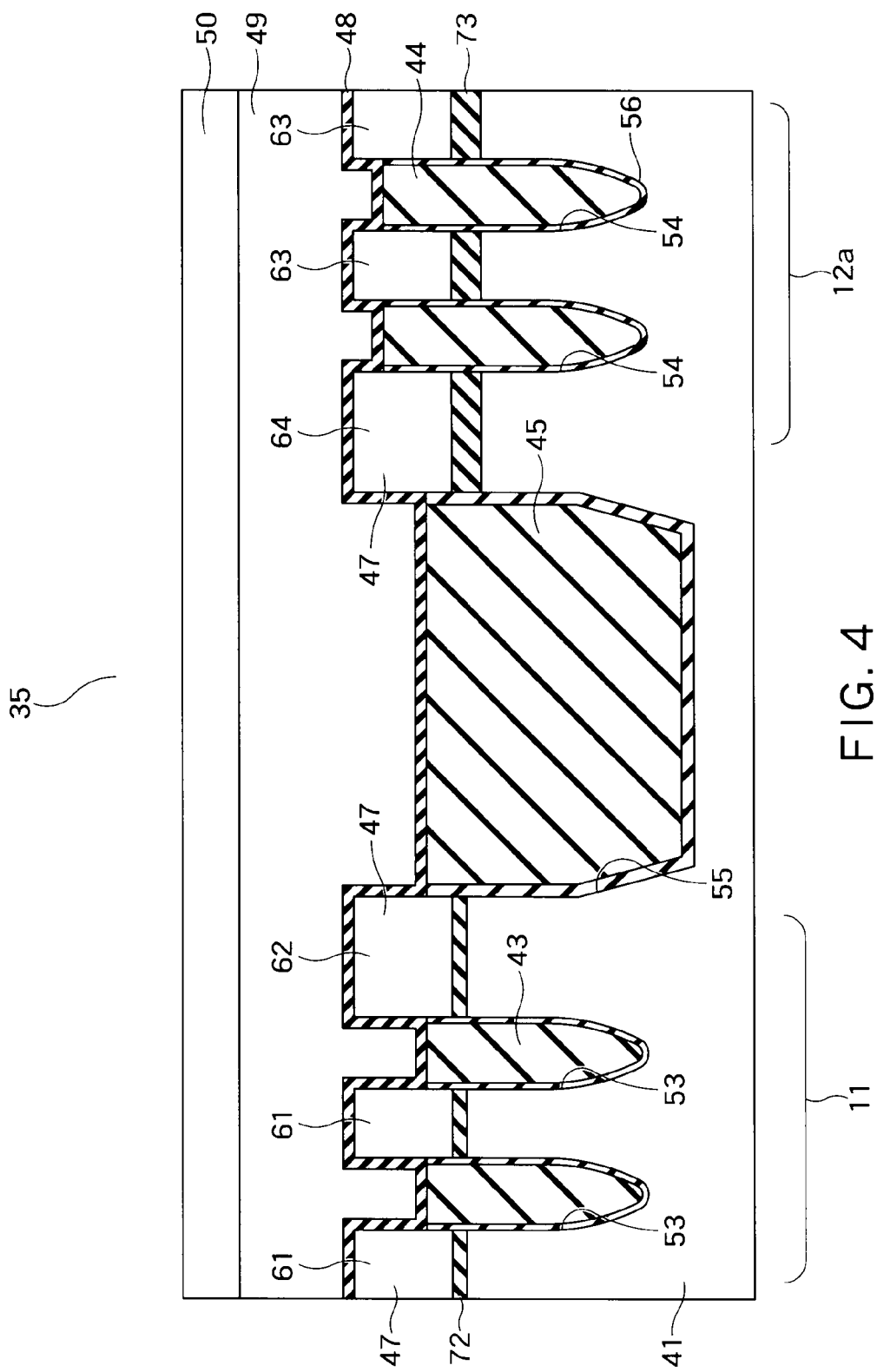
FIG. 4 is a cross sectional view (part 2) illustrating the NAND flash memory according to the embodiment.

FIG. 4 is a cross sectional view taken along a line B-B' of FIG. 2. In FIG. 4, the left side is the cell array region 11, and the right side is the row decoder unit 12a. The STI region 35 is provided between the cell array region 11 and the row decoder unit 12a to isolate the cell array region 11 and the row decoder unit 12a.

More specifically, a plurality of memory cell transistors 61 are formed in the cell array region 11. A plurality of cell array region dummy device 62 are formed at an end portion in the row direction of the cell array region 11. The trench 53 is formed between every adjacent pair of memory cell transistors 61. The device isolation insulating film 43 is embedded into each trench 53. Further, the trench 53 is also formed between the memory cell transistor 61 and the cell array region dummy device 62 which are adjacent to each other. The device isolation insulating film 43 is embedded into the trench 53.

Each of the memory cell transistors 61 and the cell array region dummy devices 62 has the gate insulating film 72 on the semiconductor substrate 41, and has the lower gate electrode 47 thereon. Each trench 53 is formed to penetrate the lower gate electrode 47 and the gate insulating film 72 to reach into the semiconductor substrate 41.

A plurality of peripheral transistors 63 are formed in the row decoder unit 12a. A plurality of peripheral circuit region dummy device 64 are formed at an end portion in the row direction of the row decoder unit 12a. The trench 54 is formed between every adjacent pair of peripheral transistors 63. The device isolation insulating film 44 is embedded into each trench 54. Further, the trench 54 is formed between the peripheral transistor 63 and the peripheral circuit region dummy device 64 which are adjacent to each other. The device isolation insulating film 44 is embedded into the trench 54. The height of the upper surfaces of the device isolation insulating films 44 embedded in the trenches 54 may be higher than the height of the upper surfaces of the device isolation insulating films 43 embedded in the trenches 53 in the cell array region 11.

Each of the peripheral transistors 63 and the peripheral circuit region dummy devices 64 has the gate insulating film 73 on the semiconductor substrate 41, and has the lower gate electrode 47 thereon. The gate insulating film 73 of each of the peripheral transistors 63 and the peripheral circuit region dummy devices 64 may be thicker than the gate insulating film 72 of each of the memory cell transistors 61 and the cell array region dummy devices 62. Each trench 54 is formed to penetrate the lower gate electrode 47 and the gate insulating film 73 to reach into the semiconductor substrate 41.

The trench 55 is wider in the row direction than the trenches 53 and 54 formed in the cell array region 11 and the row decoder unit 12a. In the STI region 35, the trench 55 is formed to penetrate the lower gate electrode 47 and the gate insulating films 72 and 73 to reach into the semiconductor substrate 41. The device isolation insulating film 45 is embedded in the trench 55. The device isolation insulating film 45 is formed so that the upper surface of the embedded device isolation insulating film 45 is higher than the upper surfaces of the gate insulating films 72 and 73 provided in the cell array region 11 and the row decoder unit 12a.

Inter-electrode insulating films 48, upper gate electrodes 49, and silicide electrodes (word line) 50 are formed to cover the device isolation insulating films 43, 44, and 45 and the lower gate electrode 47.

The protective films 56 may be formed to cover walls and bottom surfaces inside of the trenches 53, 54, and 55. The height of the upper surface of the device isolation insulating films 43, 44, and 45 in the cross section as shown in FIG. 4 may be higher than the upper surface of the device isolation insulating films 43, 44, and 45 in the cross section as shown in FIG. 3, respectively.

Figure 5:
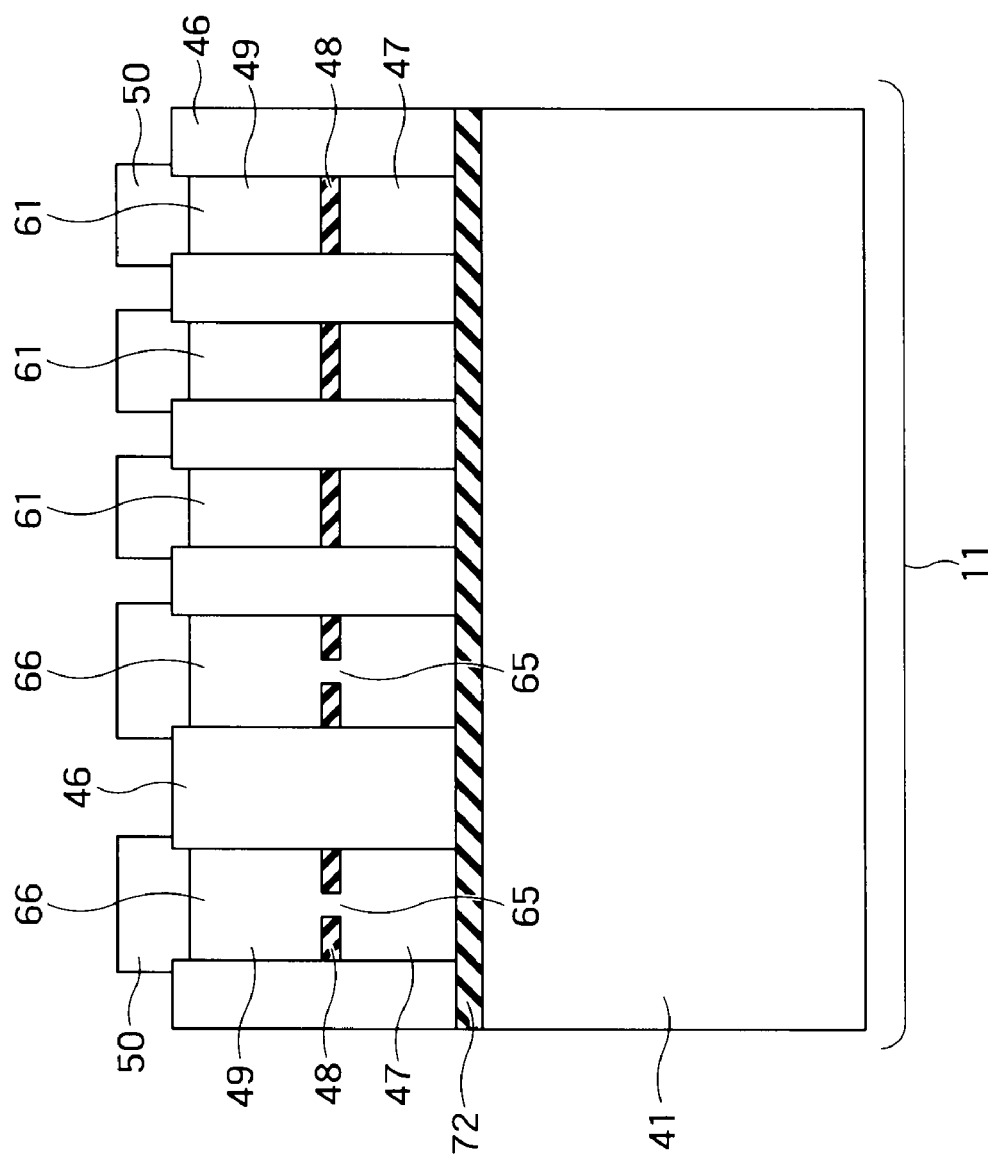
FIG. 5 is a cross sectional view (part 3) illustrating the NAND flash memory according to the embodiment.

FIG. 5 is a cross sectional view illustrating the cell array region 11, which is taken along a line C-C' of FIG. 2. The gate insulating film 72 is provided on the semiconductor substrate 41. The plurality of memory cell transistors 61 and the plurality of selection gate transistors 66 are provided on the gate insulating film 72. The inter-gate insulating film 46 is formed between every adjacent pair of memory cell transistors 61, between every adjacent pair of selection gate transistors 66, and between the memory cell transistor 61 and the selection gate transistor 66. Each of the memory cell transistors 61 and the selection gate transistors 66 has a laminated structure (gate structure), in which the lower gate electrode (floating gate) 47, the inter-electrode insulating film 48, the upper gate electrode (control gate) 49, and the silicide electrode 50 are formed on the gate insulating film 72. The height of the upper surface of the gate structure may be higher than the height of the upper surface of the inter-gate insulating film 46 provided between the gate structures. Further, the inter-gate insulating film 48 of each of the selection gate transistors 66 has an opening portion 65 connecting the lower gate electrode 47 and the upper gate electrode 49. In the drawing, impurity dispersion layers (not shown) serving as the source and the drain of the transistors are formed in the semiconductor substrate 41 below the inter-gate insulating films 46.

Figure 6:
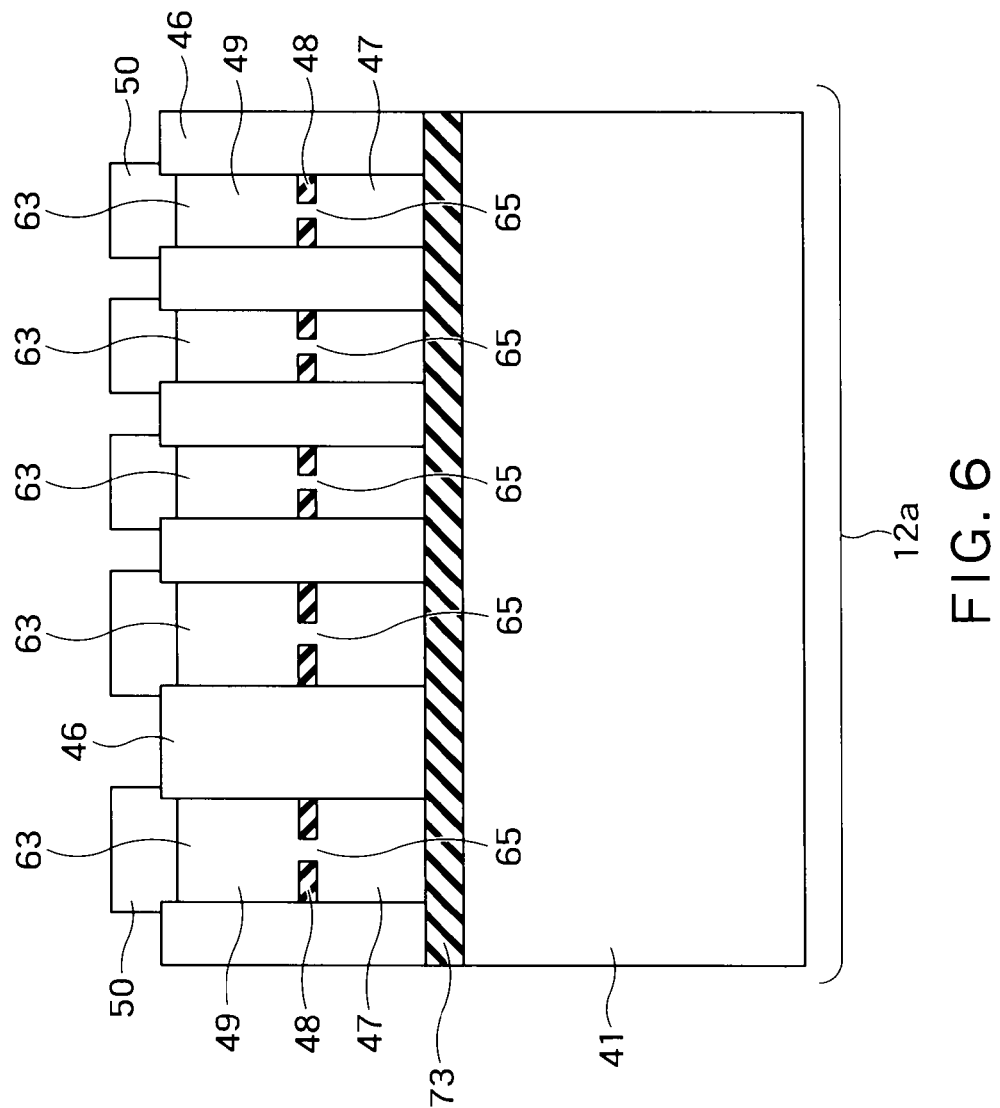
FIG. 6 is a cross sectional view (part 4) illustrating the NAND flash memory according to the embodiment.

FIG. 6 is a cross sectional view illustrating the row decoder unit 12a, which is taken along line D-D' of FIG. 2. Like the cross sectional view of the cell array region 11 as shown in FIG. 5 explained above, the gate insulating film 73 is provided on the semiconductor substrate 41. The plurality of peripheral transistors 63 are provided on the gate insulating film 73. The inter-gate insulating film 46 is formed between every adjacent pair of peripheral transistors 63. Each of the peripheral transistors 63 has a laminated structure (gate structure), in which the lower gate electrode 47, the inter-electrode insulating film 48, the upper gate electrode 49, and the silicide electrode 50 are formed on the gate insulating film 73. The height of the upper surface of the gate structure may be higher than the height of the upper surface of the inter-gate insulating film 46 provided between the gate structures. Further, the inter-gate insulating film 48 of each of the peripheral transistors 63 has the opening portion 65 connecting the lower gate electrode 47 and the upper gate electrode 49.

Subsequently, a method for producing the NAND flash memory according to the present embodiment will be explained with reference to FIGS. 7 to 10.

Figure 7:
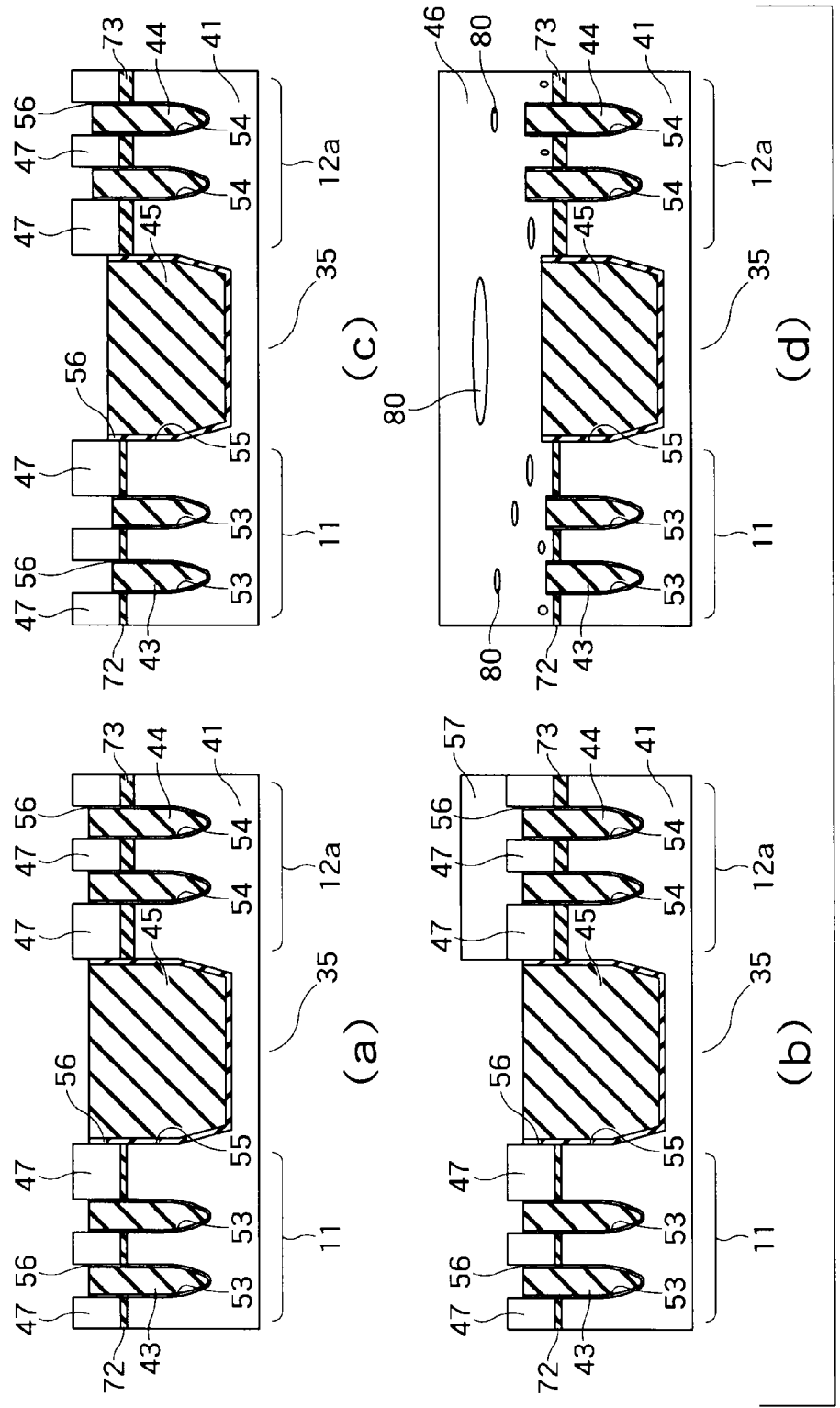
FIG. 7 is a cross sectional view (part 1) illustrating a process for producing the NAND flash memory for explaining the embodiment.
Figure 8:
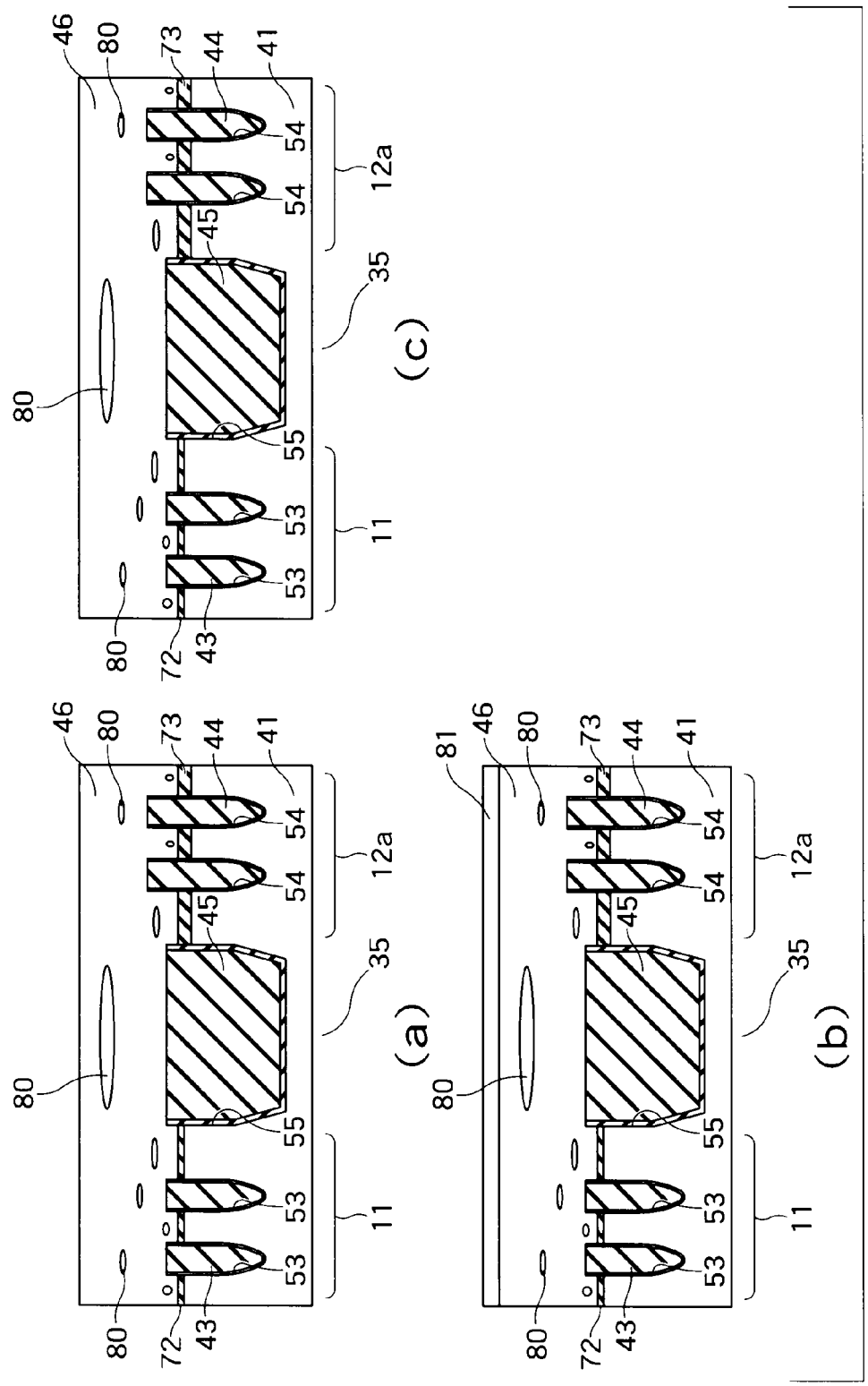
FIG. 8 is a cross sectional view (part 2) illustrating a process for producing the NAND flash memory for explaining the embodiment.
Figure 9:
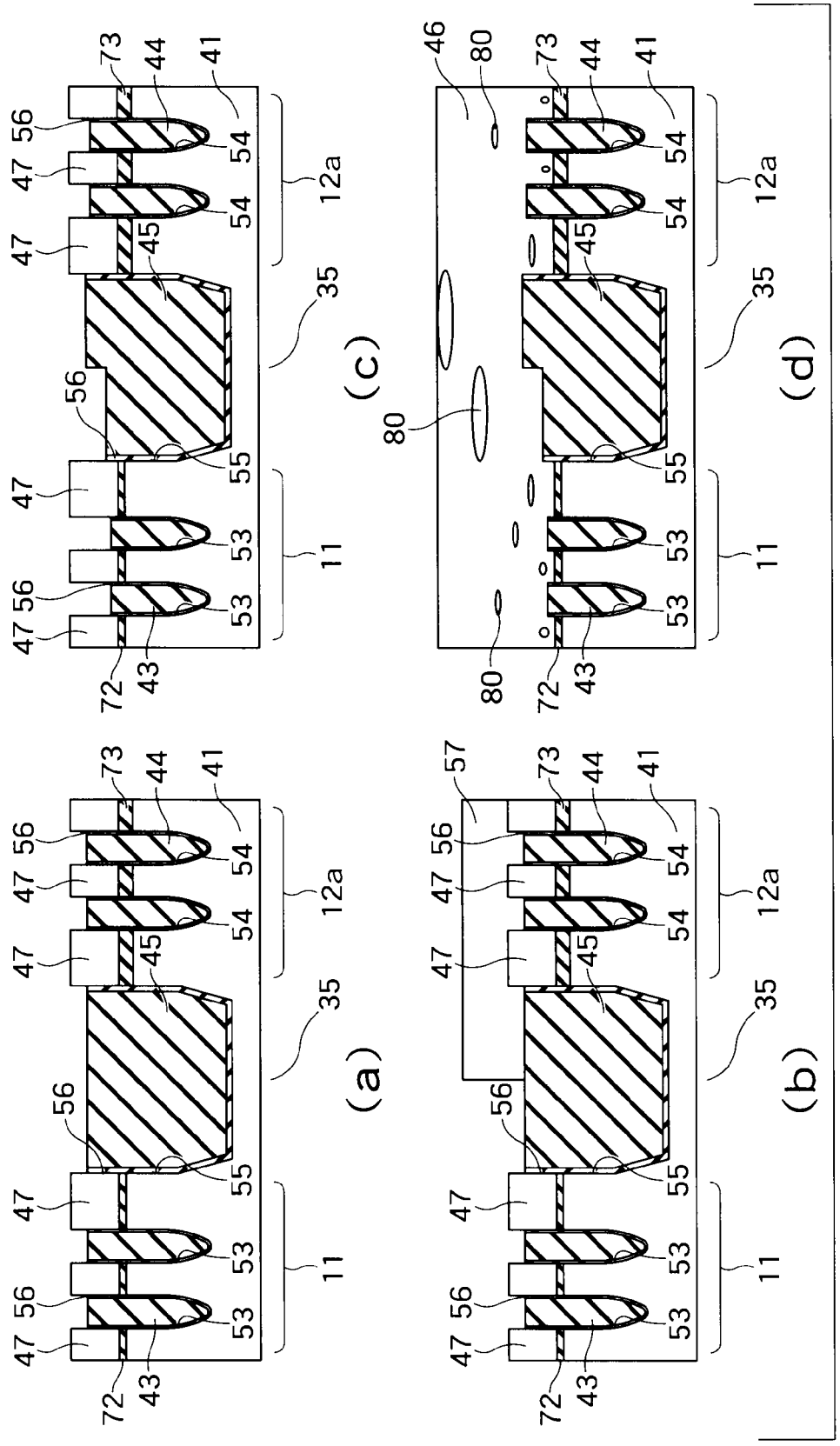
FIG. 9 is a cross sectional view (part 1) illustrating a process for producing the NAND flash memory according to a comparative example.
Figure 10:
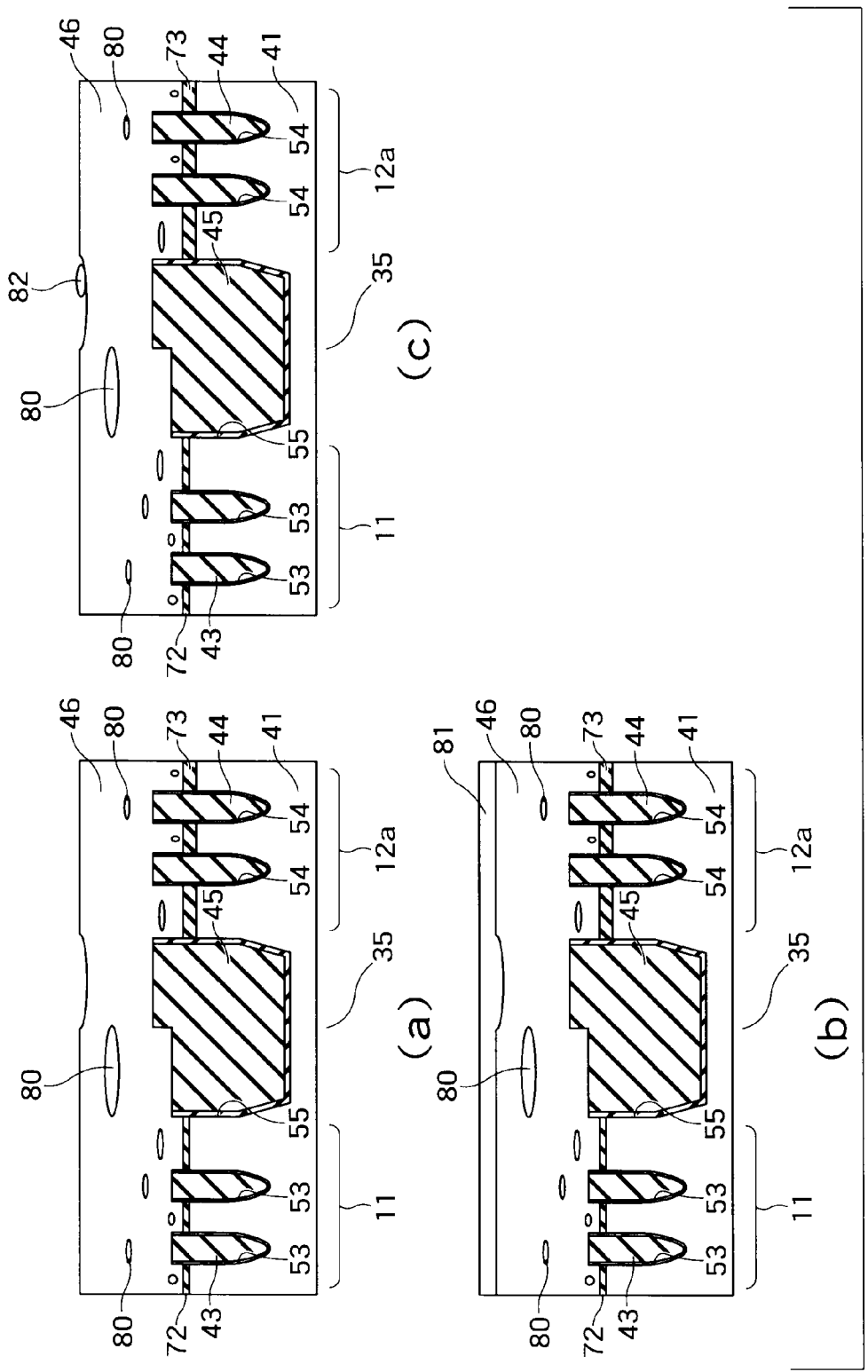
FIG. 10 is a cross sectional view (part 2) illustrating a process for producing the NAND flash memory according to the comparative example.

FIGS. 7 and 8 illustrate the process for producing the NAND flash memory according to the present embodiment. FIGS. 7 and 8 correspond to the cross sectional view taken along a line A-A' of FIG. 2. FIGS. 9 and 10 illustrate the process for producing the NAND flash memory according to a comparative example. FIGS. 9 and 10 correspond to the cross sectional view taken along a line A-A' of FIG. 2. The NAND flash memory according to the comparative example has the same structure as the NAND flash memories used in the examination conducted by the present inventors to find a short-circuited portion as described above. In other words, the NAND flash memory according to the comparative example has the same structure as the NAND flash memories in which the short-circuit has occurred.

First, as shown in FIG. 7(a), the gate insulating film 72 is formed in the cell array region 11 on the semiconductor substrate 41, and the gate insulating film 73 thicker than the gate insulating film 72 is formed in the row decoder unit 12a. The lower gate electrode 47 made of, e.g., polycrystalline silicon, is formed on the gate insulating films 72 and 73. Further, the lower gate electrode 47, the gate insulating films 72 and 73, and the semiconductor substrate 41 are etched, whereby the trenches 53, 54, and 55 are formed in the cell array region 11, the row decoder unit 12a, and the STI region 35, respectively. Then, the protective film 56 is formed to cover the wall inside of each of the trenches 53, 54, and 55. Subsequently, the device isolation insulating films 43, 44, and 45 are formed so that the trenches 53, 54, and 55 are embedded with the device isolation insulating films 43, 44, and 45.

Subsequently, the device isolation insulating films 43 in the trenches 53 in the cell array region 11 are etched so that the upper surface of the device isolation insulating films 43 is lower than the upper surface of the lower gate electrodes 47 but is higher than the upper surface of the gate insulating film 72. At this occasion, the etching process is performed using a protective mask 57 (for example, photoresist). As shown in FIG. 7(b), the protective mask 57 protects the row decoder unit 12a by covering the row decoder unit 12a but does not cover the cell array region 11 and the STI region 35 isolating the cell array region 11 and the row decoder unit 12a. Then, the upper surfaces of the device isolation insulating films 43 and 45 are etched back to a predetermined height, and thereafter, the protective mask 57 is removed.

Therefore, in the present embodiment, the etching process is performed using the protective mask 57 as described above. Accordingly, no unevenness is formed on the flat upper surface of the device isolation insulating film 45 as shown in FIG. 7(c). As described above, the upper surfaces of the device isolation insulating films 43 in the cell array region 11 are etched, whereby coupling ratios of the memory cell transistors 61 can be increased. Further, the height of the device isolation insulating film 45 is controlled so that the height of the device isolation insulating film 43 is the same as the height of the device isolation insulating film 45 at both sides of the cell array region dummy device 62 at the end portion in the row direction of the cell array region 11. Accordingly, this prevents concentration of electric field at the end portion of the cell array region dummy device 62 at one side in the row direction, and prevents residual materials of the lower gate electrodes 47 generated at the end portion in the row direction of the cell array region dummy device 62 at the side of the STI region 35. Even when the height of the device isolation insulating films 44 and the height of the device isolation insulating film 45 are different, the thickness of the gate insulating film 73 between the device isolation insulating film 44 and the device isolation insulating film 45 is thick, and accordingly, this prevents breakdown voltage characteristics of the NAND flash memory from greatly deteriorating as compared with a case where the height of the device isolation insulating film 45 is the same as the height of the device isolation insulating films 44 and the height of the device isolation insulating film 45 is different from the height of the device isolation insulating films 43.

Subsequently, in the present embodiment, the inter-gate insulating film, the upper gate electrode made of the polycrystalline silicon, and a cap nitride film are formed. Thereafter, the cap nitride film, the upper gate electrode, the inter-gate insulating film, and the lower gate electrode 47 are patterned in the word line form in the row direction, and are processed into the gate structures of the memory cell transistor 61, the cell array region dummy device 62, the peripheral transistor 63, and the peripheral circuit region dummy device 64 (See FIG. 4). Subsequently, the impurity diffusion layers serving as the sources and the drains are formed in the semiconductor substrate 41 in a self-aligning manner with the obtained gate structures. Thereafter, as shown in FIG. 7(d), the inter-gate insulating films 46 are formed on the gate insulating film 72 exposed between the memory cell transistors 61 and the like, the gate insulating film 73 exposed between the peripheral transistors 63 and the like, and the device isolation insulating films 43, 44, and 45. For example, the inter-gate insulating films 46 are formed by CVD (Chemical Vapor Deposition) method using TEOS (Tetra EthOxy Silane). In the forming process, as shown in FIG. 7(d), no voids 80 are generated in proximity to the upper surfaces of the inter-gate insulating films 46 formed on the device isolation insulating film 45. More specifically, the upper surface of the device isolation insulating film 45 is etched so that the upper surface of the device isolation insulating film 45 is low, whereby the inter-gate insulating films 46 having a sufficient thickness can be formed on the device isolation insulating film 45. This prevents the voids 80 from being generated in proximity to the upper surfaces of the inter-gate insulating films 46. As can be understood from the above explanation, the device isolation insulating films 44 are not etched. Therefore, the height of the upper surfaces of the device isolation insulating films 44 is higher than the upper surfaces of the device isolation insulating films 43 and 45. However, when the inter-gate insulating films 46 are formed on the device isolation insulating films 44 and the gate insulating film 73, the inter-gate insulating film 46 is formed to be embedded from four sides enclosed by sidewalls such as word lines and the projected device isolation insulating films 44. Even when the voids 80 are generated in the inter-gate insulating films 46, the voids 80 are covered with the overhang inter-gate insulating films 46 deposited so that the overhang inter-gate insulating films 46 attach to the sidewalls like lids, since the distance between the sidewalls is short. Therefore, the voids 80 are less likely to be generated in proximity to the upper surfaces of the inter-gate insulating films 46 over the device isolation insulating films 44.

Subsequently, in the present embodiment, the cap nitride films are removed from the upper gate electrodes 49 by an etching process. In the process, as shown in FIG. 8(a), the upper surfaces of the inter-gate insulating films 46 are etched at the same time so as to make a silicide material film having a large contact area covering not only the upper surfaces of the upper gate electrodes 49 but also the upper surfaces of the sidewalls. In the present embodiment, the voids 80 are not generated in proximity to the upper surfaces of the inter-gate insulating films 46, so that the voids 80 are prevented from being exposed on the upper surfaces of the inter-gate insulating films 46.

Subsequently, in the present embodiment, a silicide material film 81 made of, e.g., cobalt, is formed on the upper surfaces of the inter-gate insulating films 46 and the upper gate electrodes 49 as shown in FIG. 8(b). In the present embodiment, the voids 80 are not exposed on the upper surfaces of the inter-gate insulating films 46. Therefore, the cobalt does not fill the voids 80.

Subsequently, in the present embodiment, the upper gate electrodes 49 made of silicon and the silicide material film 81 are annealed so as to cause the upper gate electrodes 49 and the silicide material film 81 to be reacted. Further, the unreacted silicide material film 81 is removed by wet etching as shown in FIG. 8(c), so that the silicide electrodes 50 are selectively formed on the upper gate electrodes 49. Accordingly, the silicide electrodes 50 made of, e.g., a cobalt silicide film, are formed on the upper surfaces of the upper gate electrodes 49 (see FIGS. 5 and 6).

Like the present embodiment (see FIG. 7(a)), the process for producing the NAND flash memory according to the comparative example is as follows. As shown in FIG. 9(a), a gate insulating film 72 and a thick gate insulating film 73 are formed on a semiconductor substrate 41. A lower gate electrode 47 is formed thereon. Then, the lower gate electrode 47, the gate insulating films 72 and 73, and the semiconductor substrate 41 are etched, whereby trenches 53, 54, and 55 are formed in a cell array region 11, a row decoder unit 12a, and STI region 35, respectively. Then, a protective film 56 is formed to cover inner walls of the trenches 53, 54, and 55. Subsequently, the device isolation insulating films 43, 44, and 45 are formed so that the trenches 53, 54, and 55 are embedded therein.

Subsequently, as shown in FIG. 9(b), the device isolation insulating films 43 in the trenches 53 of the cell array region 11 are etched using a protective mask 57 covering the row decoder unit 12a and half of the STI region 35, at the side of the row decoder unit 12a, for isolating the cell array region 11 and the row decoder unit 12a.

Therefore, as shown in FIG. 9(c), half of the upper surface of the device isolation insulating film 45 embedded in the trench 55 is etched, whereby unevenness is formed on the upper surface of the device isolation insulating film 45. On the other hand, as described above, in the present embodiment, the upper surface of the device isolation insulating film 45 on which no unevenness is formed is flat, as shown in FIG. 7(c).

Further, like the present embodiment (see FIG. 7(d)), the protective mask 57 is removed. Then, the inter-gate insulating film, the upper gate electrode, and a cap nitride film are formed and patterned. Subsequently, the impurity diffusion layers serving as the sources and the drains are formed in the semiconductor substrate 41. Thereafter, the inter-gate insulating films 46 are formed on the gate insulating film 72 exposed between the memory cell transistors 61 and the like, the gate insulating film 73 exposed between the peripheral transistors 63 and the like, and the device isolation insulating films 43, 44, and 45. In the forming process, as shown in FIG. 9(d), voids 80 are generated in proximity the upper surfaces of the inter-gate insulating films 46 formed on a portion of the device isolation insulating film 45 at the side of the row decoder unit 12a. More specifically, there is unevenness formed on the upper surface of the device isolation insulating film 45. In the higher upper surface at the side of the row decoder unit 12a, it is impossible to form the inter-gate insulating films 46 having a sufficient thickness. Accordingly, the voids 80 are more likely to be generated in proximity to the upper surfaces of the inter-gate insulating films 46 at the side of the row decoder unit 12a. On the other hand, as described above, in the present embodiment, the voids 80 are more unlikely to be generated in proximity to the upper surfaces of the inter-gate insulating films 46 formed on the device isolation insulating film 45, as shown in FIG. 7(d).

Further, like the present embodiment (see FIG. 8(a)), the cap nitride films on the upper gate electrodes 49 are removed by an etching process as shown in FIG. 10(a), and the upper surfaces of the inter-gate insulating films 46 are etched at the same time. When the voids 80 are generated in proximity to the upper surfaces of the inter-gate insulating films 46, the voids 80 are exposed on the upper surfaces of the inter-gate insulating films 46 as a result of this etching process. On the other hand, as described above, in the present embodiment, the voids 80 can be prevented from being exposed on the upper surfaces of the inter-gate insulating films 46 as a result of the etching process, as shown in FIG. 8(a).

Subsequently, like the present embodiment (see FIG. 8(b)), a silicide material film 81 is formed on the upper surfaces of the upper gate electrodes 49 and the inter-gate insulating films 46 as shown in FIG. 10(b). When the voids 80 are exposed on the upper surfaces of the inter-gate insulating films 46, the silicide material film 81 may fill the voids 80. On the other hand, as described above, in the present embodiment, the silicide material film 81 can be prevented from filling the voids 80, as shown in FIG. 8(b).

Then, like the present embodiment (see FIG. 8(c)), annealing process is performed as shown in FIG. 10(c). Subsequently, the unreacted silicide material film 81 is removed by wet etching. When the silicide material film 81 fills the voids 80 exposed on the upper surfaces of the inter-gate insulating films 46, wet etching solution for removing the unreacted silicide material film 81 cannot sufficiently permeate the voids 80, and residual materials 82 of the silicide material film 81 may remain in the voids 80. These residual materials 82 may cause a short circuit between wires.

In the present embodiment as described above, the inter-gate insulating films 46 having a sufficient thickness can be formed on the voids 80 in the inter-gate insulating films 46 formed in the STI region 35 for isolating the cell array region 11 and the row decoder unit 12a. Accordingly, the voids 80 can be prevented from being generated in proximity to the upper surfaces of the inter-gate insulating films 46. Therefore, in subsequent steps, the voids 80 are not exposed on the upper surfaces of the inter-gate insulating films 46, and the silicide material film 81, which may cause a short circuit, does not fill the voids 80. Therefore, a short circuit can be prevented. In other words, yields of production of the NAND flash memories can be improved.

Further, in the present embodiment, only the shape of the protective mask 57 is changed. Therefore, it is not necessary to significantly change conventional production processes and conventional production apparatuses for producing the NAND flash memories.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising a cell array region and a peripheral circuit region provided adjacent to the cell array region with an isolation region interposed therebetween, the semiconductor device comprising:
    a substrate;
    a gate insulating film formed on the substrate;
    a plurality of first trenches formed in a column direction in the cell array region, the plurality of first trenches penetrating through the gate insulating film and reaching into the substrate;
    a plurality of first embedded insulating films embedded in the plurality of first trenches;
    a plurality of second trenches formed in the column direction in the peripheral circuit region, the plurality of second trenches penetrating through the gate insulating film and reaching into the substrate;
    a plurality of second embedded insulating films embedded in the plurality of second trenches;
    a third trench formed in the isolation region, the third trench reaching into the substrate;
    a third embedded insulating film embedded in the third trench;
    a plurality of gate structures formed on the gate insulating film in a row direction crossing the column direction so as to extend over the cell array region, the peripheral circuit region, and the isolation region; and
    a plurality of inter-gate insulating films formed in the row direction between the plurality of gate structures, the plurality of inter-gate insulating films covering the plurality of first embedded insulating films, the plurality of second embedded insulating films, and the third embedded insulating film,
    wherein an upper surface of the third embedded insulating film covered with each of the plurality of inter-gate insulating films is substantially flat,
    upper surfaces of the plurality of first embedded insulating films, upper surfaces of the plurality of second embedded insulating films, and the upper surface of the third embedded insulating film are higher than an upper surface of the gate insulating film, and
    the height of the upper surfaces of the plurality of first embedded insulating films and the upper surface of the third embedded insulating film is lower than the height of the upper surfaces of the plurality of second embedded insulating films.

2. The semiconductor device according to claim 1, wherein a row-direction width of the third embedded insulating film is larger than row-direction widths of the plurality of first embedded insulating films and the plurality of second embedded insulating films.

3. The semiconductor device according to claim 1, wherein the height of the upper surfaces of the plurality of first embedded insulating films is substantially the same as the height of the upper surface of the third embedded insulating film.

4. The semiconductor device according to claim 1, wherein a silicide electrode is provided on an upper surface of each of the gate structures.

5. The semiconductor device according to claim 4, wherein the height of an upper surface of the silicide electrode is higher than the height of upper surfaces of the plurality of inter-gate insulating films.

6. The semiconductor device according to claim 1, wherein a row-direction width of the third trench is larger than row-direction widths of the plurality of first trenches and the plurality of second trenches.

7. The semiconductor device according to claim 1, wherein each of the inter-gate insulating films has a void unexposed on an upper surface thereof.

8. The semiconductor device according to claim 1, wherein each of the gate structures has a laminated structure including a lower gate electrode, an inter-electrode insulating film, and an upper gate electrode.

9. The semiconductor device according to claim 8, wherein the inter-electrode insulating film in each of the gate structures formed in the peripheral circuit region has an opening portion connecting the lower gate electrode and the upper gate electrode.

10. The semiconductor device according to claim 1, wherein each of the inter-gate insulating films is a silicon oxide film.

11. The semiconductor device according to claim 1, wherein a portion of the gate insulating film formed in the cell array region is thinner than a portion of the gate insulating film formed in the peripheral circuit region.

12. A method for producing a semiconductor device comprising:
    forming a plurality of first trenches in a column direction in a cell array region of a substrate, forming a plurality of second trenches in the column direction in a peripheral circuit region of the substrate adjacent to the cell array region with an isolation region interposed therebetween, and forming a third trench in the isolation region of the substrate;
    forming a plurality of first embedded insulating films, a plurality of second embedded insulating films, and a third embedded insulating film, so that the plurality of first trenches, the plurality of second trenches, and the third trench are respectively embedded therein;
    forming a protective mask covering upper surfaces of the plurality of second embedded insulating films, the protective mask leaving upper surfaces of the plurality of first embedded insulating films exposed and leaving the third embedded insulating film exposed;

etching the upper surfaces of the plurality of first embedded insulating films using the protective mask as a mask, and processing the upper surface of the third embedded insulating film into a flat shape by etching;

after etching, forming a plurality of gate structures on the substrate through a gate insulating film in a row direction crossing the column direction, the plurality of gate structures extending over the cell array region, the peripheral circuit region, and the isolation region;

forming a plurality of inter-gate insulating films in the row direction between the plurality of gate structures, the inter-gate insulating films covering the plurality of first embedded insulating films, the plurality of second embedded insulating films, and the third embedded insulating film;

after forming the plurality of inter-gate insulating films, forming a silicide material film on the plurality of gate structures;

annealing the plurality of gate structures and the silicide material film so as to cause the plurality of gate structures and the silicide material film to be reacted; and removing an unreacted portion of the silicide material film.

13. The method for producing a semiconductor device according to claim 12, wherein the plurality of first embedded insulating films and the third embedded insulating film are etched so that the height of the upper surfaces of the plurality of first embedded insulating films and the upper surface of the third embedded insulating film is lower than the height of the upper surfaces of the plurality of second embedded insulating films.

14. The method for producing a semiconductor device according to claim 12, wherein the plurality of first trenches and the plurality of second trenches are formed so that row-direction widths of the plurality of first trenches and the plurality of second trenches are smaller than a row-direction width of the third trench.

15. The method for producing a semiconductor device according to claim 12, wherein the plurality of first embedded insulating films and the third embedded insulating film are etched so that the height of the upper surfaces of the plurality of first embedded insulating films is substantially the same as the height of the upper surface of the third embedded insulating film.

16. The method for producing a semiconductor device according to claim 12, wherein the plurality of inter-gate insulating films are formed using TEOS.

17. The method for producing a semiconductor device according to claim 12, wherein upper surfaces of the plurality of inter-gate insulating films are etched after the plurality of inter-gate insulating films are embedded between the plurality of gate structures, so that the height of an upper surface of each of the gate structures is higher than the height of an upper surface of each of the inter-gate insulating films.

18. The method for producing a semiconductor device according to claim 12, wherein the plurality of first embedded insulating films and the third embedded insulating film are etched so that the height of the upper surfaces of the plurality of first embedded insulating films and the third embedded insulating film is higher than the height of an upper surface of the gate insulating film.

19. The method for producing a semiconductor device according to claim 12, wherein each of the gate structures has a laminated structure including a lower gate electrode, an inter-electrode insulating film, and an upper gate electrode, and the first, second and third trenches are formed to penetrate through the lower gate electrode and the gate insulating film to reach into the substrate.

20. The method for producing a semiconductor device according to claim 19, wherein the plurality of first embedded insulating films are etched so that the height of the upper surfaces of the plurality of first embedded insulating films is lower than the height of an upper surface of the lower gate electrode but is higher than the height of an upper surface of the gate insulating film.

* * * * *